(12) United States Patent
Hong et al.

(10) Patent No.: US 12,386,522 B2
(45) Date of Patent: Aug. 12, 2025

(54) SEMICONDUCTOR MEMORY DEVICE AND OPERATING METHOD THEREOF

(71) Applicant: SAMSUNG ELECTRONICS CO., LTD., Suwon-si (KR)

(72) Inventors: Seungki Hong, Suwon-si (KR);
Woongdai Kang, Suwon-si (KR);
Youngjae Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 178 days.

(21) Appl. No.: 18/335,784

(22) Filed: Jun. 15, 2023

(65) Prior Publication Data
US 2024/0152282 A1 May 9, 2024

(30) Foreign Application Priority Data
Nov. 9, 2022 (KR) .................. 10-2022-0148607

(51) Int. Cl.
*G11C 7/10* (2006.01)
*G06F 3/06* (2006.01)
*G11C 11/406* (2006.01)

(52) U.S. Cl.
CPC .......... *G06F 3/0619* (2013.01); *G06F 3/0634* (2013.01); *G06F 3/0653* (2013.01);
(Continued)

(58) Field of Classification Search
CPC .... G06F 3/0619; G06F 3/0634; G06F 3/0653; G06F 3/0673; G11C 7/1045;
(Continued)

(56) References Cited

U.S. PATENT DOCUMENTS 4,277,675 A * 7/1981 Mar .................... H03K 21/18
377/128
6,201,754 B1 * 3/2001 Ooishi ............... G11C 11/4074
365/210.1
(Continued)

FOREIGN PATENT DOCUMENTS

| KR | 10-2019-0128890 | 11/2019 |
| KR | 10-2075665 | 2/2020 |
| WO | 2022093368 | 5/2022 |

*Primary Examiner* — Michael T Tran
(74) *Attorney, Agent, or Firm* — MORGAN, LEWIS & BOCKIUS LLP

(57) ABSTRACT

A method of operating a semiconductor memory device includes setting an operating mode of a mode register to a first operating mode to allow a refresh operation to be performed at intervals of a first period, counting an active command and a pre-charge command by control logic in the first operating mode to generate counting information, comparing a threshold count value with the counting information by the control logic to determine whether the counting information reaches the threshold count value, generating an adaptive mode signal by the control logic when it is determined that the counting information reaches the threshold count value and setting the operating mode of the mode register to a second operating mode in which the refresh operation is performed at intervals of a second period in response to the adaptive mode signal. The second period is less than the first period.

20 Claims, 7 Drawing Sheets

(52) U.S. Cl.
CPC .......... *G06F 3/0673* (2013.01); *G11C 7/1045* (2013.01); *G11C 11/40622* (2013.01)

(58) Field of Classification Search
CPC .......... G11C 11/40622; G11C 11/4076; G11C 11/4094; G11C 2211/4061; G11C 11/406; G11C 11/40611; G11C 11/40618
USPC ............................................ 365/203, 230.05
See application file for complete search history.

(56) References Cited

U.S. PATENT DOCUMENTS

| | | | |
|---|---|---|---|
| 6,789,209 B1 * | 9/2004 | Suzuki | G11C 7/222 |
| | | | 713/401 |
| 9,202,549 B2 | 12/2015 | Lee et al. | |
| 10,373,667 B2 | 8/2019 | Benedict et al. | |
| 10,593,392 B1 | 3/2020 | Johnson et al. | |
| 11,222,682 B1 | 1/2022 | Enomoto et al. | |
| 11,302,376 B2 | 4/2022 | Lee et al. | |
| 2003/0189862 A1 * | 10/2003 | Yokoyama | G11C 7/22 |
| | | | 365/200 |
| 2010/0250841 A1 * | 9/2010 | Ikarashi | G06F 13/1689 |
| | | | 711/E12.001 |
| 2011/0153928 A1 * | 6/2011 | Avudaiyappan | G06F 1/3275 |
| | | | 711/E12.001 |
| 2015/0009769 A1 * | 1/2015 | Dong | G11C 11/40618 |
| | | | 365/194 |
| 2015/0032975 A1 * | 1/2015 | Ruberg | G11C 7/1075 |
| | | | 711/149 |
| 2015/0243345 A1 * | 8/2015 | Kim | G11C 11/40622 |
| | | | 365/236 |
| 2016/0148654 A1 * | 5/2016 | Sohn | G11C 7/109 |
| | | | 365/189.011 |
| 2019/0267077 A1 | 8/2019 | Ito et al. | |
| 2019/0347019 A1 | 11/2019 | Shim et al. | |
| 2021/0050051 A1 * | 2/2021 | Yang | G11C 16/10 |
| 2022/0121398 A1 | 4/2022 | Nale et al. | |
| 2022/0189532 A1 | 6/2022 | Nale et al. | |

\* cited by examiner

SEMICONDUCTOR MEMORY DEVICE AND OPERATING METHOD THEREOF

CROSS-REFERENCE TO RELATED APPLICATIONS

This U.S. patent application claims priority under 35 U.S.C. § 119 to Korean Patent Application No. 10-2022-0148607, filed on Nov. 9, 2022, in the Korean Intellectual Property Office, the disclosure of which is incorporated by reference in its entirety herein.

TECHNICAL FIELD

Embodiments of the present disclosure relate to a semiconductor memory device and operating method thereof, and more particularly, relate to a semiconductor memory device performing an operation to mitigate a row hammer phenomenon, and operating method thereof.

DISCUSSION OF RELATED ART

A semiconductor memory device refers to a memory device that is implemented using a semiconductor material such as silicon (Si), germanium (Ge), gallium arsenide (GaAs), indium phosphide (InP), etc. Semiconductor memory devices may be classified into volatile memory devices and nonvolatile memory devices.

The nonvolatile memory device retains data stored therein even when power is not supplied thereto. The nonvolatile memory devices may include a NAND flash memory (NAND), a vertical NAND flash memory (Vertical NAND), a NOR Flash Memory, a resistive random access memory, a phase-change memory, a magnetoresistive random access memory, etc.

Data stored in the volatile memory device may be lost when power is interrupted. The volatile memory devices may include a static random access memory (SRAM), a dynamic random access memory (DRAM), latches, flip-flops, and registers.

The volatile memory device such as the dynamic random access memory (DRAM) determines a value of data stored therein based on charges stored in a capacitor. Since charges stored in the capacitor may leak over time, the volatile memory device periodically performs a refresh operation. However, when the refresh operation is performed on memory cells connected to a given word line, data of the memory cells connected to adjacent word lines may be lost according to a row hammer phenomenon.

SUMMARY

Embodiments of the present disclosure provide a memory device that mitigates a row hammer phenomenon by controlling an operating mode of a mode register.

Embodiments of the present disclosure provide a method of operating a memory device that mitigates a row hammer phenomenon by controlling an operating mode of a mode register.

According to an embodiment of the present disclosure, a method of operating a semiconductor memory device including a control logic for controlling a memory cell array including a plurality of memory cells, a mode register, and a mode register control logic, which includes setting an operating mode of the mode register to a first operating mode to allow a refresh operation to be performed on the memory cell array at intervals of a first period, counting an active command and a pre-charge command by the control logic in the first operating mode to generate counting information, comparing a threshold count value with the counting information by the control logic to determine whether the counting information reaches the threshold count value, generating an adaptive mode signal by the control logic when it is determined that the counting information reaches the threshold count value and setting the operating mode of the mode register to a second operating mode in which the refresh operation is performed at intervals of a second period in response to the adaptive mode signal, and the second period is less than the first period.

According to an embodiment of the present disclosure, a semiconductor memory device includes a control logic that generates an active command, a pre-charge command, and a refresh control signal for controlling a memory cell array including a plurality of memory cells, a mode register that stores an operating mode, and a mode register control logic that generates an adaptive mode signal for changing the operating mode of the mode register based on the active command and the pre-charge command. The operating mode is set to a first operating mode to perform a refresh operation on the memory cell array at intervals of a first period and a second operating mode to perform the refresh operation on the memory cell array at intervals of a second period. The control logic performs the refresh operation based on one of the first operating mode and the second operating mode, based on the adaptive mode signal.

According to an embodiment of the present disclosure, a mode register control logic for controlling an operating mode of a mode register includes a pre-charge active counter that generates a flag signal by comparing counting information generated by counting an active command and a pre-charge command with a threshold count value, and an adaptive signal generator that generates an adaptive mode signal when the flag is generated. The mode register is set to a first operating mode in which a refresh operation is performed at intervals of a first period when the adaptive mode signal is not generated. The mode register is set to a second operating mode in which the refresh operation is performed at intervals of a second period when the adaptive mode signal is generated. The second period is less than the first period.

BRIEF DESCRIPTION OF THE FIGURES

A detailed description of each drawing is provided to facilitate a more thorough understanding of the drawings referenced in the detailed description of the present disclosure.

DETAILED DESCRIPTION

Hereinafter, embodiments of the present disclosure are described to such an extent that one of ordinary skill in the art may implement the present disclosure.

Figure 1:
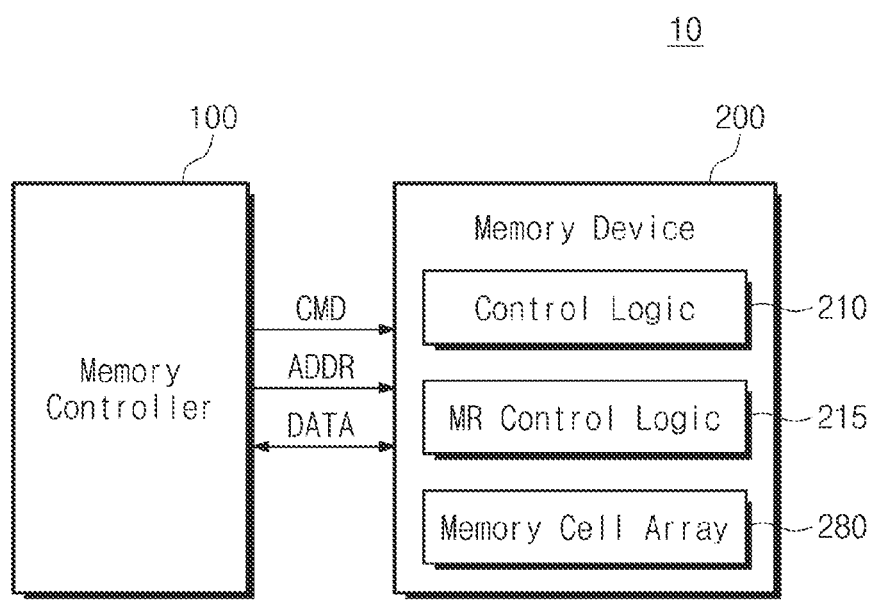
FIG. 1 is a block diagram illustrating a memory system, according to an embodiment of the present disclosure.

FIG. 1 is a block diagram illustrating a memory system, according to an embodiment of the present disclosure.

Referring to FIG. 1, a memory system 10 may include a memory controller 100 (e.g., a control circuit) and a memory device 200.

The memory controller 100 may control memory operations such as writing and reading by providing various signals to the memory device 200 through a memory interface (e.g., an interface circuit). For example, the memory controller 100 may access data DATA of a memory cell array 280 by providing a command CMD and an address ADDR to the memory device 200. The address ADDR may indicate a location of a memory cell(s) or a word line(s) within the memory cell array 280 storing the data DATA.

The command CMD may include an active command for a normal memory operation such as data writing and data reading, a pre-charge command, and a refresh command for a refresh operation. The active command may refer to a command for converting the state of the memory cell array 280 into an active state so as to write data to or read data from the memory cell array 280. For example, the active state may enable data to be written to or read from the memory cell array 280. According to the active command, memory cells included in the memory cell array 280 may be driven. In this specification, the term "access" may mean driving a memory cell row of a bank array included in the memory cell array 280 in response to an active command of the memory controller 100.

The pre-charge command may refer to a command for converting the state of the memory cell array 280 from an active state to a standby state after data writing or reading has completed. A pre-charge operation may be performed on bank arrays of the memory cell array 280 by the pre-charge command.

The refresh command may refer to a command for performing a refresh operation on the memory cell array 280. The memory controller 100 may access the memory device 200 according to a request from an external host of the memory system 10. The memory controller 100 may communicate with the external host using various protocols. The refresh operation may be used to prevent loss of data stored in the memory cell array 280.

The memory device 200 may be a dynamic random access memory (DRAM) such as a Double Data Rate Synchronous Dynamic Random Access Memory (DDR SDRAM), a Low Power Double Data Rate (LPDDR) SDRAM, a Graphics Double Data Rate (GDDR) SDRAM, a Rambus Dynamic Random Access Memory (RDRAM), etc.

The memory device 200 may include a control logic 210 (e.g., a first logic circuit), a mode register (MR) control logic 215 (e.g., a second logic circuit), and the memory cell array 280. The control logic 210 may include a mode register and may be configured to control operations of the memory device 200 based on the command CMD and address ADDR received from the memory controller 100. The mode register control logic 215 may be configured to control or change the operating mode of the mode register based on signals received from the control logic 210. Hereinafter, the memory device 200 will be described in detail with reference to FIG. 2.

Figure 2:
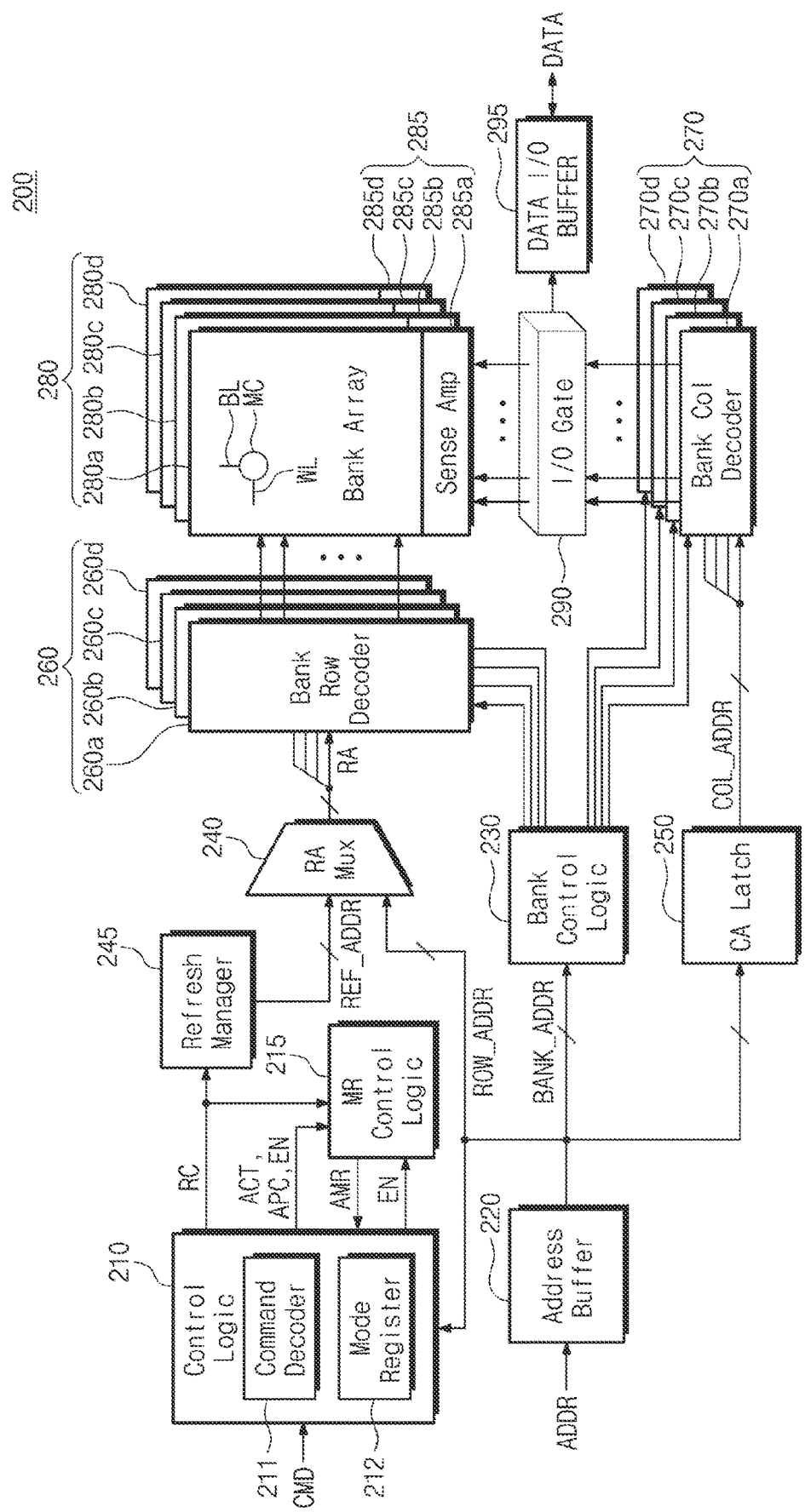
FIG. 2 is a diagram illustrating a memory device, according to an embodiment of the present disclosure.

FIG. 2 is a diagram illustrating a memory device, according to an embodiment of the present disclosure.

Referring to FIG. 2, the memory device 200 may include the control logic 210, the mode register control logic 215, an address buffer 220, bank control logic 230 (e.g., a logic circuit), a refresh manager 245 (e.g., a refresh circuit), and a row address multiplexer 240, a column address latch 250, a row decoder 260 (e.g., a first decoder circuit), a column decoder (e.g., a second decoder circuit) 270, the memory cell array 280, a sense amplifier unit 285, an input/output gating circuit 290, and a data input/output buffer 295.

The memory cell array 280 may include first to fourth bank arrays 280a, 280b, 280c, and 280d. The row decoder 260 may include first to fourth bank row decoders 260a, 260b, 260c, and 260d respectively connected to the first to fourth bank arrays 280a, 280b, 280c, and 280d. The column decoder 270 may include first to fourth bank column decoders 270a, 270b, 270c, and 270d respectively connected to the first to fourth bank arrays 280a, 280b, 280c, and 280d. The sense amplifier unit 285 may include first to fourth bank sense amplifiers 285a, 285b, 285c, and 285d respectively connected to the first to fourth bank arrays 280a, 280b, 280c, and 280d.

The first to fourth bank arrays 280a, 280b, 280c, and 280d, the first to fourth bank sense amplifiers 285a, 285b, 285c, and 285d, the first to fourth bank column decoders 270a, 270b, 270c, and 270d, and the first to fourth bank row decoders 260a, 260b, 260c, and 260d may configure first to fourth banks, respectively. Each of the first to fourth bank arrays 280a, 280b, 280c, and 280d includes a plurality of word lines WL, a plurality of bit lines BL, and a plurality of memory cells MC arranged at the intersections of the word lines WL and the bit lines BL.

The address buffer 220 may receive the address ADDR including a bank address BANK_ADDR, a row address ROW_ADDR, and a column address COL_ADDR from the memory controller 100.

The address buffer 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. In response to the bank control signals, a bank row decoder corresponding to the bank address BANK_ADDR among the first to fourth bank row decoders 260a, 260b, 260c, and 260d may be activated, and a bank column decoder corresponding to the bank address BANK_ADDR among the first to fourth bank column decoders 270a, 270b, 270c, and 270d may be activated.

The refresh manager 245 may receive a refresh control signal RC from the control logic 210 and may sequentially generate refresh addresses REF_ADDR whose values increase.

The row address multiplexer 240 may receive the row address ROW_ADDR from the address buffer 220 and the refresh row address REF_ADDR from the refresh manager 245.

The row address multiplexer 240 may selectively output the row address ROW_ADDR or the refresh row address REF_ADDR as a row address RA. The row address RA output from the row address multiplexer 240 may be applied to the first to fourth bank row decoders 260a, 260b, 260c, and 260d, respectively.

The bank row decoder activated by the bank control logic 230 among the first to fourth bank row decoders 260a, 260b, 260c, and 260d may decode the row address RA output from the row address multiplexer 240 to activate the word line corresponding to the row address RA. For example, the activated bank row decoder may apply a word line driving voltage to the word line corresponding to the row address.

The column address latch 250 may receive the column address COL_ADDR from the address buffer 220 and may temporarily store the received column address COL_ADDR. Also, the column address latch 250 may gradually increase the received column address COL_ADDR in a burst mode. The column address latch 250 may apply the temporarily stored or gradually increased column address COL_ADDR to the first to fourth bank column decoders 270a, 270b, 270c, and 270d, respectively.

The bank column decoder activated by the bank control logic 230 among the first to fourth bank column decoders 270a, 270b, 270c, and 270d may activate the sense amplifier corresponding to the bank address BANK_ADDR and the column address COL_ADDR through the input/output gating circuit 290.

Each of the input/output gating circuits of the input/output gating circuit 290 may include circuits for gating input/output data, read data latches for storing data output from the first to fourth bank arrays 280a, 280b, 280c, and 280d, and write drivers for writing data to the first to fourth bank arrays 280a, 280b, 280c, and 280d.

The data input/output buffer 295 may provide data to the input/output gating circuit 290 based on a clock signal provided from the memory controller 100 in a write operation, and may transfer data provided from the input/output gating circuit 290 to the memory controller 100 in a read operation.

The control logic 210 may control the operation of the memory device 200. For example, the control logic 210 may generate control signals to allow the memory device 200 to perform a write operation or a read operation.

The control logic 210 may include a command decoder 211 (e.g., a decoder circuit) for decoding the command CMD received from the memory controller 100 and a mode register 212 for setting an operating mode of the memory device 200.

The control logic 210 may generate control signals for a refresh operation of the first to fourth bank arrays 280a, 280b, 280c, and 280d depending on a refresh command from the memory controller 100.

The command decoder 211 may output an active command, a pre-charge command, the refresh control signal RC, or an enable signal EN to the mode register control logic 215 based on the command CMD. In an example, when the command CMD is an active command, the command decoder 211 may output an active command ACT, a pre-charge command APC, and the refresh control signal RC to the mode register control logic 215. In an example, when the command CMD is a refresh command, the command decoder 211 may output the refresh control signal RC to the refresh manager 245.

The control logic 210 may be configured to perform a refresh operation at uniform intervals based on the operating mode stored in the mode register 212. In an example, the control logic 210 is configured to perform a refresh operation at intervals of a first period or a second period based on a first operating mode or a second operating mode stored in the mode register 212.

When a refresh operation is performed, the control logic 210 may be configured to generate the refresh control signal RC. The refresh control signal RC generated by the control logic 210 may be output to the refresh manager 245 and the mode register control logic 215.

The mode register 212 may include a plurality of registers that store information associated with operating modes for setting an operating environment of the memory device 200. The control logic 210 may be configured to periodically perform a refresh operation based on an operating mode stored in the registers of the mode register 212.

The mode register 212 may include information associated with the first operating mode in which a refresh operation is performed at intervals of a first period and the second operating mode in which a refresh operation is performed at intervals of a second period. In an embodiment, a duration of the second period is less than the first period. The mode register 212 may be configured to set the first operating mode or the second operating mode based on an adaptive mode signal AMR received from the mode register control logic 215. For example, the mode register 212 could store a variable set to a first value to indicate the first operating mode and a set to a second value different from the first value to indicate the second operating mode.

For example, when the adaptive mode signal AMR is not received by the mode register 212, the first operating mode MODE1 of the mode register 212 is selected and a refresh operation may be performed at intervals of the first period (e.g., a first refresh period). For example, when the mode register 212 receives the adaptive mode signal AMR, the mode register 212 indicates the second operating mode MODE2 and a refresh operation may be performed at intervals of the second period (e.g., a second refresh period).

However, the first operating mode and the second operating mode are just examples for convenience of description, and the operating modes of the mode register 212 may include third, fourth, . . . , N-th operating modes with different refresh periods.

The mode register control logic 215 may be configured to receive the active command ACT, the pre-charge command APC, the enable signal EN, and the refresh control signal RC from the control logic 210.

The mode register control logic 215 may be configured to control the operating modes of mode register 212. The mode register control logic 215 may be configured to generate the adaptive mode signal AMR such that the operating mode of the mode register 212 is changed based on the active command ACT and the pre-charge command APC. Hereinafter, a specific configuration and operation method of the mode register control logic 215 will be described with reference to FIGS. 3 to 5.

Figure 3:
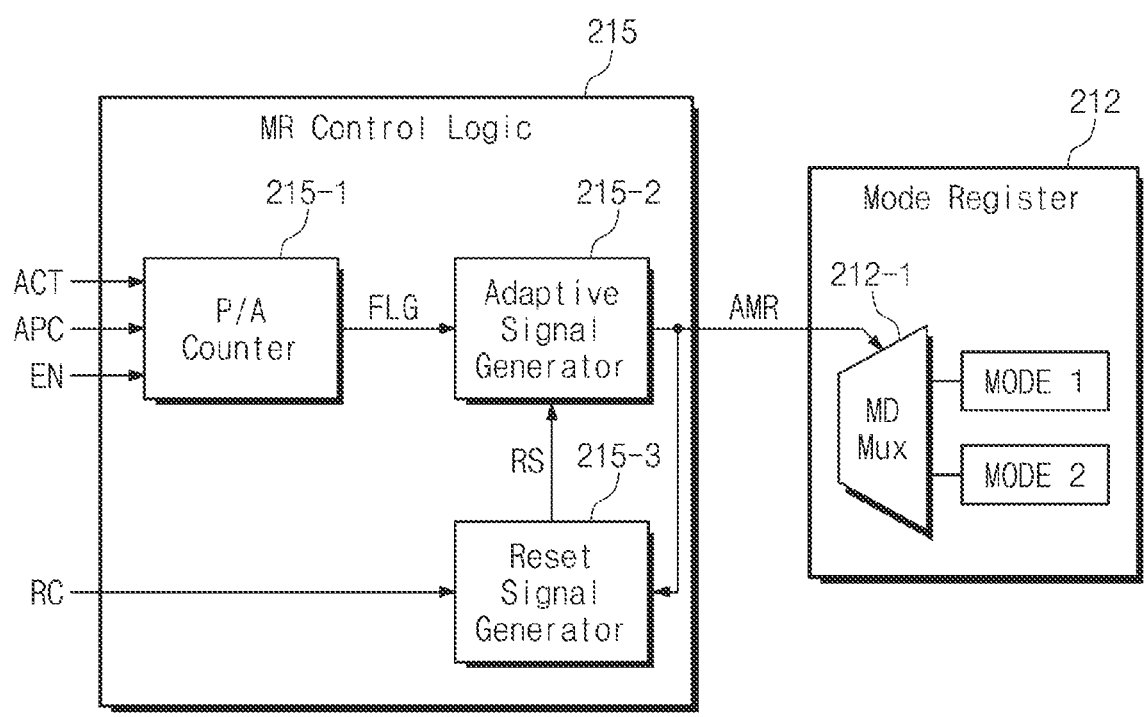
FIG. 3 is a block diagram illustrating a mode register control logic and a mode register of FIG. 2.
Figure 4:
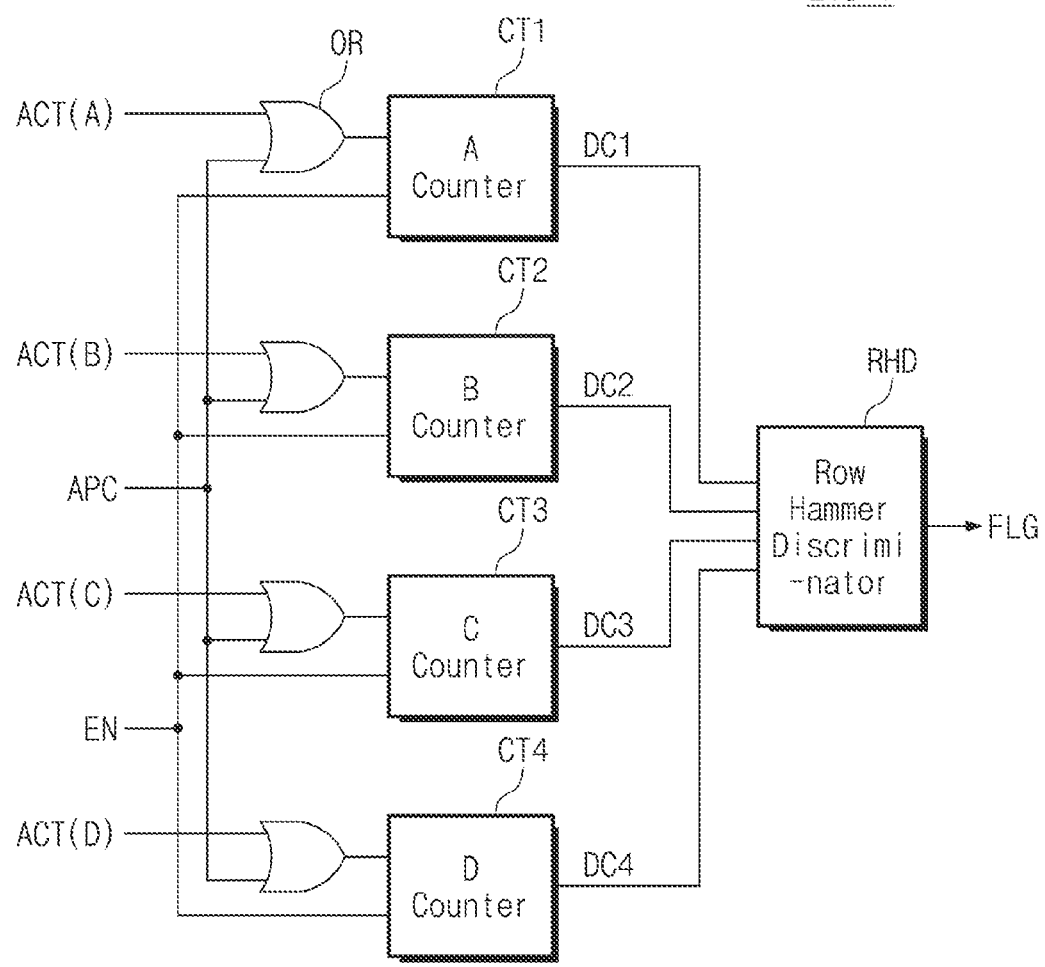
FIG. 4 is a diagram illustrating a specific configuration of a pre-charge active counter of FIG. 3.
Figure 5:
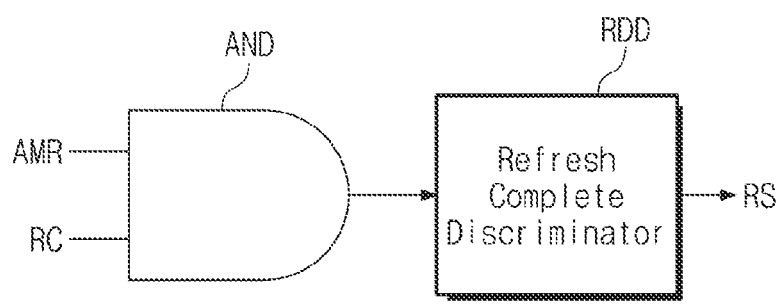
FIG. 5 is a diagram illustrating a specific configuration of a reset signal generator of FIG. 3.

FIG. 3 is a block diagram illustrating a mode register control circuit and a mode register of FIG. 2. FIG. 4 is a diagram illustrating a specific configuration of a pre-charge active counter of FIG. 3. FIG. 5 is a diagram illustrating a specific configuration of a reset signal generator of FIG. 3.

Referring to FIG. 3, the mode register control logic 215 includes a pre-charge active counter 215-1 (e.g., a counter circuit), an adaptive signal generator 215-2, and a reset signal generator 215-3.

The pre-charge active counter 215-1 may be configured to receive the active command ACT, the pre-charge command APC, and the enable signal EN from the control logic 210. The pre-charge active counter 215-1 may be configured to generate a flag FLG (e.g., a flag signal) by counting the received active command ACT and pre-charge command APC.

The active command ACT may include a plurality of bank active commands for accessing each of the plurality of bank arrays. For example, the active command ACT may include a first bank active command ACT(A) for accessing the first bank array 280*a*, a second bank active command ACT(B) for accessing the second bank array 280*b*, a third bank active command ACT(C) for accessing the third bank array 280*c*, and a fourth active command ACT(D) for accessing the fourth bank array 280*d*.

The pre-charge command APC may include an all bank pre-charge command for pre-charging all of the plurality of bank arrays.

As illustrated in FIG. 4, the pre-charge active counter 215-1 may include OR gates OR, first to fourth counters CT1, CT2, CT3, and CT4 (e.g., counter circuits), and a row hammer discriminator RHD (e.g., a logic circuit).

The pre-charge active counter 215-1 may include the first to fourth counters CT1, CT2, CT3, and CT4 corresponding to the first to fourth bank arrays 280*a*, 280*b*, 280*c*, and 280*d*. The first counter CT1 may be configured to receive the first bank active command ACT(A), the second counter CT2 may be configured to receive the second bank active command ACT(B), the third counter CT3 may be configured to receive the third bank active command ACT(C), and the fourth counter CT4 may be configured to receive the fourth bank active command ACT(D). The first to fourth counters CT1, CT2, CT3, and CT4 may be configured to receive the pre-charge command APC.

The pre-charge active counter 215-1 may include OR gates OR corresponding to the first to fourth counters CT4, respectively. Each of the bank active command and the all bank pre-charge command may be input to an OR gate OR corresponding to each counter, and an output of the OR gate OR may be provided as an input of the counter.

The first counter CT1 may be configured to generate first counting information DC1 (e.g., a first counting signal) by counting the first bank active command ACT(A) and the pre-charge command APC, the second counter CT2 may be configured to generate second counting information DC2 (e.g., a second counting signal) by counting the second bank active command ACT(B) and the pre-charge command APC, the third counter CT3 may be configured to generate third counting information DC3 (e.g., a third counting signal) by counting the third bank active command ACT(C) and the pre-charge command APC, and the fourth counter CT4 may be configured to generate fourth counting information DC4 (e.g., a fourth counting signal) by counting the fourth bank active command ACT(D) and the pre-charge command APC.

The first to fourth counters CT1, CT2, CT3, and CT4 may be configured to receive the enable signal EN, respectively. The enable signal EN may be activated based on the operating mode of the mode register 212.

For example, when the operating mode of the mode register 212 is a first operating mode MODE1, the control logic 210 may activate the enable signal EN received at the pre-charge active counter 215-1. For example, when the operating mode of the mode register 212 is a second operating mode MODE2, the control logic 210 may deactivate the enable signal EN received at the pre-charge active counter 215-1. For example, a level of the enable signal EN when deactivated is different from a level of the enable signal EN when activated.

When the enable signal EN is activated, the first to fourth counters CT1, CT2, CT3, and CT4 may be activated to count the received bank active commands and the pre-charge commands APC. Accordingly, the first to fourth counters CT1, CT2, CT3, and CT4 may generate the first to fourth counting information DC1, DC2, DC3, and DC4. When the enable signal EN is deactivated, the first to fourth counters CT1, CT2, CT3, and CT4 are deactivated so that the counting operation is not performed and the first to fourth counting information DC1, DC2, DC3, and DC4 may not be generated.

The row hammer discriminator RHD may be configured to receive the first to fourth counting information DC1, DC2, DC3, and DC4 from the first to fourth counters CT1, CT2, CT3, and CT4. The row hammer discriminator RHD may be configured to generate the flag FLG by determining a row hammer danger state based on the first to fourth counting information DC1, DC2, DC3, and DC4. For example, the row hammer discriminator RHD may determine whether a row hammer phenomenon is likely to occur based on the first to fourth counting information DC1, DC2, DC3, and DC4.

In an example, a threshold count value may be set in the row hammer discriminator RHD. The row hammer discriminator RHD may be configured to determine whether the first to fourth counting information DC1, DC2, DC3, and DC4 reach the threshold count value. The row hammer discriminator RHD may be configured to generate the flag FLG when at least one of the received first to fourth counting information DC1, DC2, DC3, and DC4 reaches the threshold count value.

Referring back to FIG. 3, the adaptive signal generator 215-2 may be configured to receive the flag FLG signal and a reset signal RS. When the flag FLG signal is received, the adaptive signal generator 215-2 may be configured to generate the adaptive mode signal AMR. For example, the adaptive signal generator 215-2 may generate the adaptive mode signal AMR in response to receiving the flag FLG signal. The adaptive signal generator 215-2 may be configured to generate and output the adaptive mode signal AMR to the mode register 212 and the reset signal generator 215-3.

The reset signal generator 215-3 may be configured to receive the adaptive mode signal AMR and the refresh control signal RC. The refresh signal generator may be configured to generate the reset signal RS based on the adaptive mode signal AMR and the refresh control signal RC. Hereinafter, an operation of generating the reset signal RS in the reset signal generator 215-3 will be described in detail.

As illustrated in FIG. 5, the reset signal generator 215-3 may include an AND gate AND and a refresh complete discriminator RDD (e.g., a logic circuit). The adaptive mode signal AMR and the refresh control signal RC may be input to the AND gate AND.

For example, the AND gate AND outputs the refresh control signal RC as an output signal only when the adaptive mode signal AMR is received, and when the adaptive mode signal AMR is not generated from the adaptive signal generator 215-2, the AND gate AND may not output a signal. When the adaptive mode signal AMR is generated, the refresh control signal RC output from the AND gate AND may be input to the refresh complete discriminator RDD. For example, the adaptive mode signal AMR not being generated may mean that that the adaptive mode signal AMR has a logic low state. For example, the AND gate AND not outputting a signal may mean that the AND gate outputs a signal having the logic low state.

The refresh complete discriminator RDD may be configured to determine whether the refresh operation has completed for all memory cells of the memory cell array based on the refresh control signal RC output from the AND gate AND. For example, the AND gate AND outputting the refresh control signal RC may mean the AND gate AND outputs a signal having a logic high state when the refresh control signal RC has the logic high state and the adaptive mode signal AMR has the logic high state. The refresh complete discriminator RDD may be configured to generate the reset signal RS when the refresh operation for all memory cells has completed.

In an example, the refresh complete discriminator RDD may be configured to count the number of memory cells for which the refresh operation is performed based on the refresh control signal RC. The refresh complete discriminator RDD may be configured to set a refresh completion count value and to determine whether the number of refreshed memory cells reaches the refresh completion count value. When the counted value reaches the refresh completion count value, the refresh complete discriminator RDD may be configured to generate the reset signal RS.

Referring back to FIG. 3, when the reset signal RS is received, the adaptive signal generator 215-2 may be reset and set to an initial state in which the adaptive mode signal AMR is not generated. For example, the adaptive signal generator 215-2 may set the adaptive mode signal AMR to a logic low state after being set to the initial state. The adaptive signal generator 215-2 may be configured not to generate the adaptive mode signal AMR until the flag FLG is received again after the reset signal RS is received. For example, the adaptive signal generator 215-2 may maintain a level of the adaptive mode signal AMR at the logic low state until it receives the flag signal FLG.

The mode register 212 may be configured to receive the adaptive mode signal AMR. The mode register 212 may include a mode multiplexer 212-1. The mode multiplexer 212-1 may be configured to select one of the first operating mode MODE1 and the second operating mode MODE2 based on the adaptive mode signal AMR received at the mode register 212. The mode register 212 may be set to an operating mode selected by the mode multiplexer 212-1.

For example, when the mode multiplexer 212-1 does not receive the adaptive mode signal AMR, the first operating mode MODE1 is selected and the control logic 210 may perform the refresh operation based on the first operating mode MODEL For example, when the mode multiplexer 212-1 receives the adaptive mode signal AMR, the second operating mode MODE2 is selected and the control logic 210 may perform the refresh operation based on the second operating mode MODE2. For example, the first operating mode MODE1 may be selected when the adaptive mode signal AMR has a first logic state (e.g., low logic state) and the second operating mode MODE2 may be selected when the adaptive mode signal AMR has a second other logic state (e.g., high logic state).

Hereinafter, the execution of the first operating mode MODE1 and the second operating mode MODE2 will be described in detail with reference to FIGS. 6 and 7.

Figure 6:
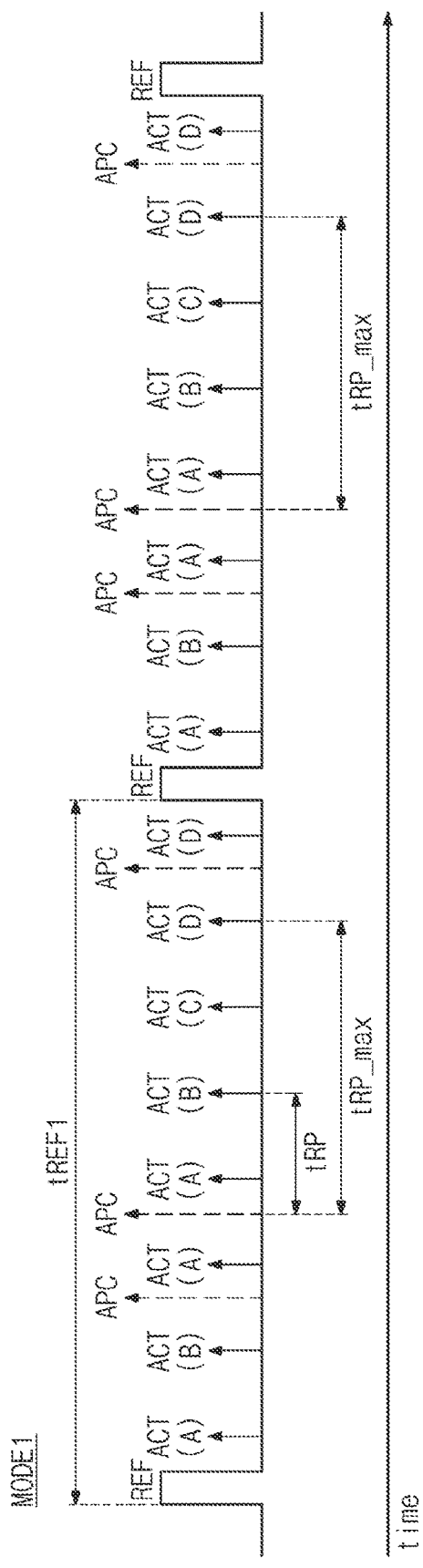
FIG. 6 is a diagram illustrating how an active command, a pre-charge command, and a refresh command are generated when a mode register is in a first operating mode.

FIG. 6 is a diagram illustrating how an active command, a pre-charge command, and a refresh command are generated when a mode register is in a first operating mode. FIG. 7 is a diagram illustrating how an active command, a pre-charge command, and a refresh command are generated when a mode register is in a second operating mode.

Referring to FIG. 6, in the first operating mode MODE1, a refresh operation may be performed at a first period tREF1.

After the refresh operation is performed, an active command and a pre-charge command may be generated during the first period tREF1. For example, eight active commands may be generated during the first period tREF1.

The active command may include the plurality of bank active commands for accessing each of the plurality of bank arrays. For example, the active commands may include the first bank active command ACT(A) for accessing the first bank array, the second bank active command ACT(B) for accessing the second bank array, the third bank active command ACT(C) for accessing the third bank array, and the fourth active command ACT(D) for accessing the fourth bank array. In an embodiment, the active commands during a given period (e.g., tRef1) need not include all of the first through fourth active commands. For example, one or more of the first through fourth active commands may not be received during the given period.

The pre-charge command may include an all bank pre-charge command for pre-charging all of the plurality of bank arrays.

The pre-charge command may be generated between active commands with respect to the same bank array. For example, after the first bank active command ACT(A) for the first bank array 280a is generated and accessed, the pre-charge command APC may be generated before the first bank active command ACT(A) for the first bank array 280a is generated again.

In an embodiment, the pre-charge command APC is not generated between active commands for different bank arrays. For example, after the first bank active command ACT(A) for the first bank array 280a is generated, the pre-charge command APC is not generated while the second bank active command ACT(B), the third bank active command ACT(C), and the fourth bank active command ACT(D) are sequentially generated.

In this specification, the time between the pre-charge command APC and the active command may be defined as a pre-charge reference time tRP. For example, the time between the pre-charge command APC and the first bank active command ACT(A), the time between the pre-charge command APC and the second bank active command ACT(B), the time between the pre-charge command APC and the third bank active command ACT(C), or the time between the pre-charge command APC and the fourth bank active command ACT(D) may be the pre-charge reference time tRP.

In this specification, the maximum time between the pre-charge command and the active command may be defined as a maximum pre-charge reference time tRP_max. For example, the maximum time among the times between the pre-charge command APC and the first to fourth bank active commands ACT(A), ACT(B), ACT(C), and ACT(D) may be defined as the maximum pre-charge reference time tRP_max. In the first operating mode MODE1 of FIG. 6, the time between the pre-charge command APC and the fourth bank active command ACT(D) in the first period tREF1 may be the maximum pre-charge reference time tRP_max.

When the interval between the pre-charge command and the active command exceeds a specified range, the row hammer phenomenon may occur, and this may be defined as the row hammer phenomenon by the maximum pre-charge reference time tRP_max. For example, in the case of FIG. 6, the row hammer phenomenon may occur in the fourth bank array by the maximum pre-charge reference time tRP_max.

Figure 7:
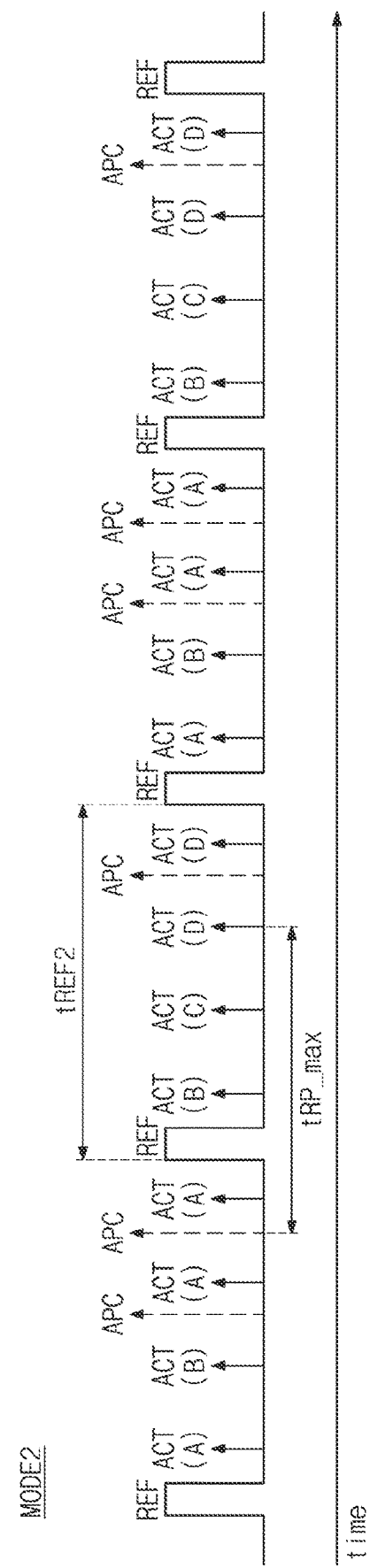
FIG. 7 is a diagram illustrating how an active command, a pre-charge command, and a refresh command are generated when a mode register is in a second operating mode.

Referring to FIG. 7, in the second operating mode MODE2, the refresh operation may be performed at a second period tREF2. In an embodiment, the second period tREF2 is less than the first period tREF1. For example, the second period tREF2 may be half of the first period tREF1, and four active commands may be generated during the second period tREF2. For example, more active commands may be generated during the first period tREF1 as compared to the second period tREF2.

The active command may include the plurality of bank active commands for accessing each of the plurality of bank arrays. The pre-charge command may include an all bank pre-charge command for pre-charging all of the plurality of bank arrays.

The all-bank pre-charge active command may be generated between active commands with regard to the same bank array. In an embodiment, the all bank pre-charge active command is not generated between active commands with regard to different bank arrays.

In the case of the second operating mode MODE2, unlike the first operating mode MODE1 in FIG. 6, a refresh operation may be performed during the maximum pre-charge reference time tRP_max. In detail, when the refresh operation is performed at the second period tREF2 according to the second operating mode MODE2, the row hammer phenomenon due to the maximum pre-charge reference time tRP_max should not occur.

In an embodiment according to the present disclosure, an operating mode may be selected based on the active command and the pre-charge command. Accordingly, in an embodiment according to the present disclosure, the row hammer phenomenon caused by the maximum pre-charge reference time tRP_max may be mitigated by controlling the refresh period.

Hereinafter, an operating method of an embodiment according to the present disclosure will be described in detail with reference to FIGS. 8 and 9.

Figure 8:
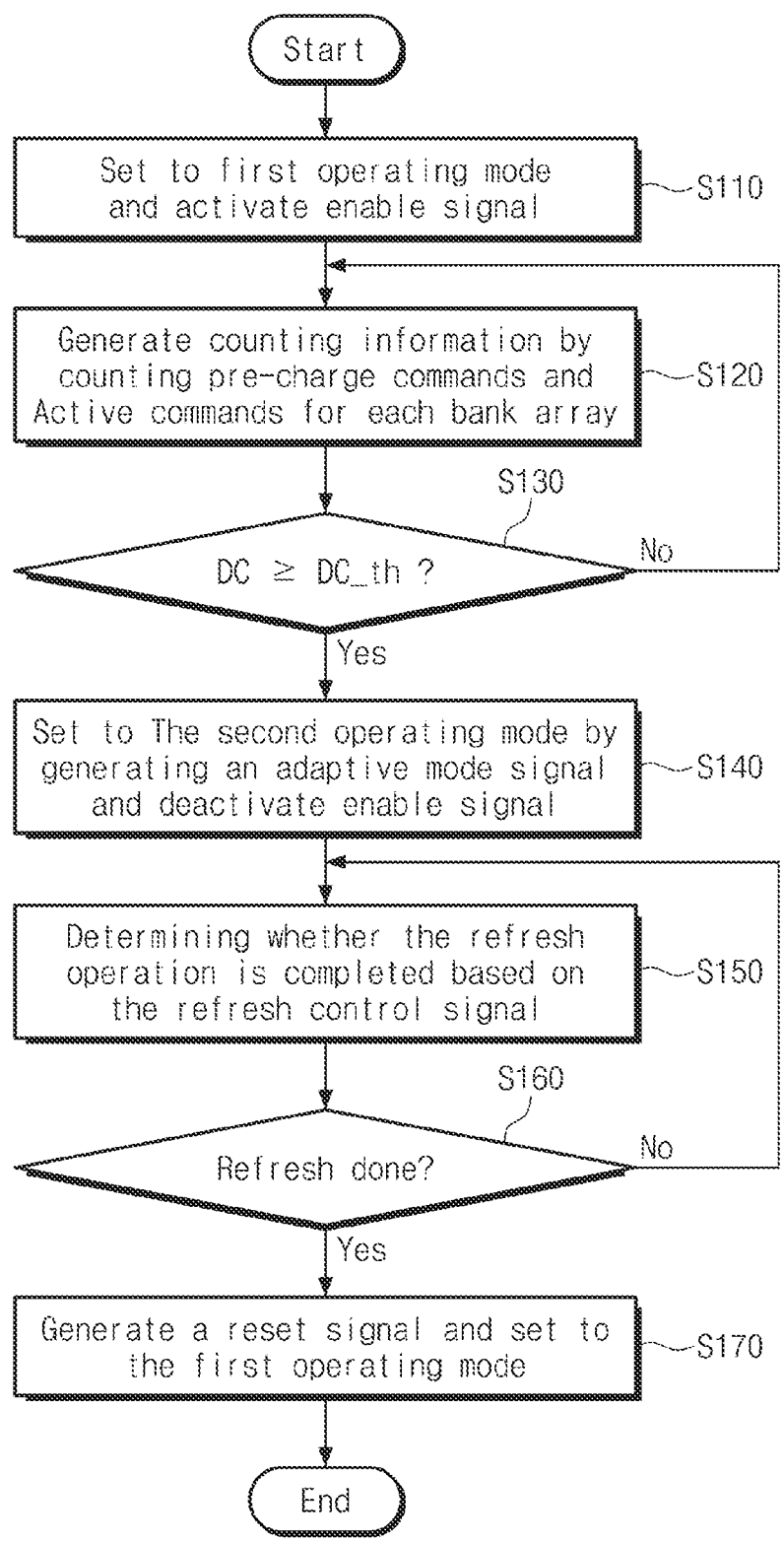
FIG. 8 is a flowchart illustrating an operating method of an embodiment, according to the present disclosure.

FIG. 8 is a flowchart illustrating an operating method of an embodiment, according to the present disclosure. FIG. 9 is a diagram illustrating how an operating mode is varied, according to an operating method of FIG. 8.

Figure 9:
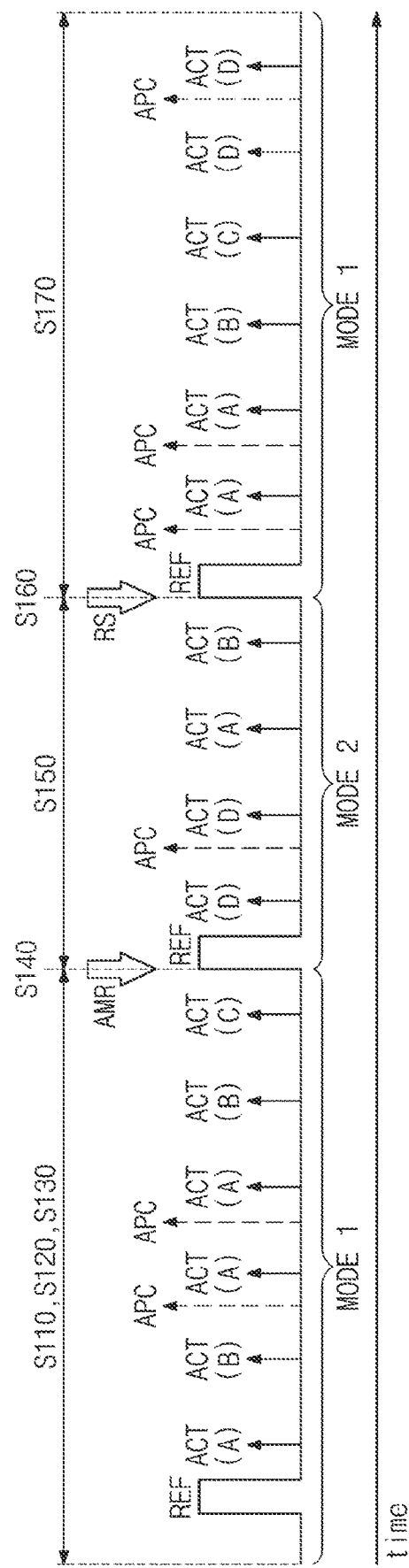
FIG. 9 is a diagram illustrating how an operating mode is varied, according to an operating method of FIG. 8.

Referring to FIGS. 8 and 9, in operation S110, the mode register 212 may be set to the first operating mode MODE1. For example, the refresh operation may be performed at the first period tREF1, and active commands may be generated several times (e.g., six, eight times, etc.) during the first period tREF1. In the first operating mode MODE1, the enable signal EN is activated so that the pre-charge active counter 215-1 of FIGS. 3 and 4 may be activated.

In operation S120, the first to fourth counters CT1, CT2, CT3, and CT4 of the pre-charge active counter 215-1 may be configured to generate first to fourth counting information DC1, DC2, DC3, and DC4 by counting the first to fourth bank active commands ACT(A), ACT(B), ACT(C), and ACT(D) and the pre-charge command APC.

In operation S130, the row hammer discriminator RHD of the pre-charge active counter 215-1 may compare the first to fourth counting information DC1, DC2, DC3, and DC4 with a threshold count value DC_th. As a result of the comparison, when at least one of the first to fourth counting pieces of information DC1, DC2, DC3, and DC4 reaches the threshold count value DC_th, the row hammer discriminator RHD may generate the flag FLG. For example, generating the flag signal FLG may mean setting the flag signal FLG to a certain state (e.g., logic high).

In operation S140, when the flag FLG signal is received, the adaptive signal generator 215-2 may generate the adaptive mode signal AMR and may output the adaptive mode signal AMR to the reset signal generator 215-3 and the mode register 212. When the adaptive mode signal AMR is received, the mode register 212 may set the operating mode to the second operating mode MODE2.

When operating in the second operating mode MODE2, the control logic 210 may deactivate the enable signal EN.

In operation S150, when the refresh operation is performed at the second operating mode MODE2, the reset signal generator 215-3 may determine whether the refresh operation has completed for all memory cells based on the refresh control signal RC.

In an example, the refresh complete discriminator RDD may count the number of memory cells refreshed based on the refresh control signal RC. The refresh complete discriminator RDD may set the refresh completion count value and may determine whether the number of refreshed memory cells reaches the refresh completion count value.

When the refresh operation is performed on all memory cells in operation S160, operation S170 may be performed.

In operation S170, the reset signal generator 215-3 may generate the reset signal RS and may output the reset signal RS to the adaptive signal generator 215-2. When the reset signal RS is received, the adaptive signal generator 215-2 may reset its state and may not generate the adaptive mode signal AMR. When the adaptive mode signal AMR is not generated, the mode register 212 may set the operating mode to the first operating mode MODE1

According to an embodiment of the present disclosure, a memory device that mitigates a row hammer phenomenon by controlling an operating mode of a mode register is provided.

According to an embodiment of the present disclosure, a method of operating a memory device that mitigates a row hammer phenomenon by controlling an operating mode of a mode register is provided.

The above descriptions are specific embodiments for carrying out the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A method of operating a semiconductor memory device including a control logic for controlling a memory cell array including a plurality of memory cells, a mode register, and a mode register control logic, the method comprising:

setting an operating mode of the mode register to a first operating mode to allow a refresh operation to be performed on the memory cell array at intervals of a first period;

counting an active command and a pre-charge command by the control logic in the first operating mode to generate counting information;

comparing a threshold count value with the counting information by the control logic to determine whether the counting information reaches the threshold count value;

generating an adaptive mode signal by the control logic when it is determined that the counting information reaches the threshold count value; and setting the operating mode of the mode register to a second operating mode in which the refresh operation is performed at intervals of a second period in response to the adaptive mode signal, and wherein the second period is less than the first period.

2. The method of claim 1, wherein the memory cell array includes a first bank array and a second bank array, wherein the active command includes a first bank active command for accessing the first bank array and a second bank active command for accessing the second bank array, wherein the pre-charge command includes an all bank pre-charge command for pre-charging all of the first bank array and the second bank array, wherein the counting information includes first counting information generated by counting the first bank active command and the all bank pre-charge command and second counting information generated by counting the second bank active command and the all bank pre-charge command, and wherein the comparing of the threshold count value with the counting information includes determining whether at least one of the first counting information and the second counting information reaches the threshold count value.

3. The method of claim 2, wherein the mode register control logic includes a pre-charge active counter and an adaptive signal generator, wherein, in the comparing of the threshold count value with the counting information, the pre-charge active counter generates a flag signal when at least one of the first counting information and the second counting information reaches the threshold count value as a result of the comparison, and wherein the adaptive signal generator generates the adaptive mode signal when the flag signal is generated.

4. The method of claim 3, wherein the pre-charge active counter comprises:

a first counter configured to generate the first counting information by counting the first bank active command and the all bank pre-charge command;

a second counter configured to generate the second counting information by counting the second bank active command and the all bank pre-charge command; and a logic circuit configured to receive the first counting information and the second counting information to generate the flag signal.

5. The method of claim 4, wherein the control circuit is configured to output an enable signal to the first counter and the second counter, wherein, in the first operating mode, the enable signal is activated to activate the first counter and the second counter, and wherein, in the second operating mode, the enable signal is deactivated to deactivate the first counter and the second counter.

6. The method of claim 1, further comprising:

when the refresh operation is performed in the second operating mode, determining whether the refresh operation with regard to the plurality of memory cells has completed based on a refresh control signal generated to perform the refresh operation by the control logic; and when it is determined that the refresh operation with regard to the plurality of the memory cells has completed, generating a reset signal by the mode register control logic to set the operating mode of the mode register to the first operating mode in which the refresh operation is performed at the intervals of the first period.

7. The method of claim 6, wherein the mode register control logic comprises a reset signal generator, and wherein, in the determining whether the refresh operation with regard to the plurality of memory cells has completed, the reset signal generator sets a refresh completion count value, counts the number of the memory cells on which the refresh operation is performed to determine a counted value, and determines whether the counted value reaches the refresh completion count value.

8. A semiconductor memory device comprising:

a control logic configured to generate an active command, a pre-charge command, and a refresh control signal for controlling a memory cell array including a plurality of memory cells;

a mode register configured to store an operating mode; and a mode register control logic configured to generate an adaptive mode signal for changing the operating mode of the mode register based on the active command and the pre-charge command, and wherein the operating mode is set to one of a first operating mode set to perform a refresh operation on the memory cell array at intervals of a first period and a second operating mode to perform the refresh operation on the memory cell array at intervals of a second period, and wherein the control logic is configured to perform the refresh operation based on one of the first operating mode and the second operating mode, based on the adaptive mode signal.

9. The semiconductor memory device of claim 8, wherein the mode register control logic comprises:

a pre-charge active counter configured to generate a flag signal by counting the active command and the pre-charge command; and an adaptive signal generator configured to generate an adaptive mode signal when the flag signal is generated, and wherein the control logic is configured to allow the refresh operation to be performed in the first operating mode when the adaptive mode signal is generated, and to allow the refresh operation to be performed in the second operating mode when the adaptive mode signal is not generated.

10. The semiconductor memory device of claim 9, wherein the memory cell array includes a first bank array and a second bank array, wherein the active command includes a first bank active command for accessing the first bank array and a second bank active command for accessing the second bank array, and wherein the pre-charge command includes an all bank pre-charge command for pre-charging all of the first bank array and the second bank array.

11. The semiconductor memory device of claim 10, wherein the pre-charge active counter comprises:

a first counter configured to generate first counting information by counting the first bank active command and the all bank pre-charge command;

a second counter configured to generate second counting information by counting the second bank active command and the all bank pre-charge command; and a logic circuit configured to receive the first counting information and the second counting information to generate the flag signal.

12. The semiconductor memory device of claim 11, wherein the logic circuit is configured to set a threshold count value and to generate the flag signal when at least one of the first counting information and the second counting information reaches the threshold count value.

13. The semiconductor memory device of claim 11, wherein the control circuit is configured to output an enable signal to the first counter and the second counter,
wherein, in the first operating mode, the enable signal is activated to activate the first counter and the second counter, and
wherein, in the second operating mode, the enable signal is deactivated to deactivate the first counter and the second counter.

14. The semiconductor memory device of claim 9, wherein the mode register control logic includes a reset signal generator, and
wherein the reset signal generator comprises:
an AND gate receiving the adaptive mode signal and the refresh control signal as an input; and
a logic circuit configured to generate a reset signal by determining whether all the memory cells are refreshed based on an output signal of the AND gate.

15. The semiconductor memory device of claim 14, wherein the reset signal generator is configured to set a refresh completion count value, to count the number of the memory cells on which the refresh operation is performed to generate a counted value, and to determine whether the counted value reaches the refresh completion count value to generate the reset signal.

16. The semiconductor memory device of claim 15, wherein the adaptive signal generator is configured to receive the reset signal, and
wherein the adaptive signal generator is reset to not generate the adaptive mode signal in response to receipt of the reset signal.

17. The semiconductor memory device of claim 8, wherein the second period is half of the first period.

18. A mode register control logic for controlling an operating mode of a mode register comprising:
a pre-charge active counter configured to generate a flag signal by comparing counting information generated by counting an active command and a pre-charge command with a threshold count value; and
an adaptive signal generator configured to generate an adaptive mode signal when the flag signal is generated,
wherein the mode register is set to a first operating mode in which a refresh operation is performed at intervals of a first period when the adaptive mode signal is not generated,
wherein the mode register is set to a second operating mode in which the refresh operation is performed at intervals of a second period when the adaptive mode signal is not generated, and
wherein the second period is less than the first period.

19. The mode register control logic of claim 18, wherein the mode register control logic further includes a reset signal generator, and
wherein the reset signal generator comprises:
an AND gate receiving the adaptive mode signal and the refresh control signal as input; and
a logic circuit configured to generate a reset signal by determining whether memory cells of a memory device are refreshed based on an output signal of the AND gate.

20. The mode register control logic of claim 19, wherein the reset signal generator is configured to set a refresh completion count value, to count the number of memory cells on which the refresh operation is performed to determine a counted value, and to determine whether the counted value reaches the refresh completion count value to generate the reset signal.

* * * * *